(12) United States Patent
Marks et al.

(10) Patent No.: US 7,605,394 B2
(45) Date of Patent: Oct. 20, 2009

(54) SILOXANE-POLYMER DIELECTRIC COMPOSITIONS AND RELATED ORGANIC FIELD-EFFECT TRANSISTORS

(75) Inventors: Tobin J. Marks, Evanston, IL (US); Antonio Facchetti, Chicago, IL (US); Myung-Han Yoon, Evanston, IL (US); He Yan, Skokie, IL (US)

(73) Assignee: Northwestern University, Evanston, IL (US)

( * ) Notice: Subject to any disclaimer, the term of this patent is extended or adjusted under 35 U.S.C. 154(b) by 466 days.

(21) Appl. No.: 11/315,076

(22) Filed: Dec. 22, 2005

(65) Prior Publication Data

US 2006/0202195 A1 Sep. 14, 2006

Related U.S. Application Data

(60) Provisional application No. 60/638,862, filed on Dec. 23, 2004.

(51) Int. Cl.
*H01L 35/24* (2006.01)

(52) U.S. Cl. .................. 257/40; 427/512; 427/568; 427/515; 525/55; 525/56; 528/29; 106/287.1; 106/287.11; 106/287.13; 106/287.14; 438/99

(58) Field of Classification Search ............ 525/56; 427/512, 515, 568; 428/447; 106/287.1, 106/287.11, 287.13, 287.14; 257/40; 438/99
See application file for complete search history.

(56) References Cited

U.S. PATENT DOCUMENTS

| | | | | |
|---|---|---|---|---|
| 6,380,271 | B1 | 4/2002 | Enoki et al. | 521/77 |
| 6,585,914 | B2 | 7/2003 | Marks et al. | 252/500 |
| 6,737,365 | B1 * | 5/2004 | Kloster et al. | 438/778 |
| 6,783,852 | B2 * | 8/2004 | Inada et al. | 428/364 |
| 6,891,237 | B1 | 5/2005 | Bao et al. | 257/410 |
| 7,029,945 | B2 | 4/2006 | Veres et al. | 438/99 |
| 7,270,845 | B2 * | 9/2007 | Japp et al. | 427/97.5 |
| 2004/0216641 | A1 * | 11/2004 | Hamada et al. | 106/287.16 |
| 2005/0176970 | A1 | 8/2005 | Marks et al. | 549/41 |
| 2006/0186401 | A1 | 8/2006 | Marks et al. | 257/40 |
| 2008/0161464 | A1 | 7/2008 | Marks et al. | 524/401 |
| 2008/0161524 | A1 | 7/2008 | Yan et al. | |

FOREIGN PATENT DOCUMENTS

| | | |
|---|---|---|
| JP | 2000-309752 | 11/2000 |
| WO | 2005/060624 | 7/2005 |

OTHER PUBLICATIONS

Facchetti et al., "Gate Dielectrics for Organic Field-Effect Transistors: New Opportunities for Organic Electronics," *Adv. Mater.*, 2005: 17, 1705-1725.
Jong et al., "Miscibility Study of Poly(styrene-co-vinylphenol) with Poly(n-butyl methacrylate) by NMR," *Macromolecules*, 1990: 23, 5071-5074.
Kabeta et al., "Preparation of Substituted Network Polysilanes by a Disproportionation Reaction of Alkoxydisilanes in the Presence of Alkoxysilanes," *J. Polym. Sci. A: Polym. Chem.*, 1996: 34(14), 2991-2998.
Park et al., "Grafting of Polycaprolactone onto Poly(ethylene-co-vinyl alcohol) and Application to Polyethylene-based Bioerodable Blends," *J. Polym. Sci. B: Polym. Phys.*, 2002: 40(22), 2561-2569.
Yan et al., "Organic field-effect transistors based on a crosslinkable polymer blend as the semiconducting layer," *Applied Physics Letters*, 2005: 87, 183501-1-183501-3.
Yoon et al., "Low-Voltage Organic Field-Effect Transistors and Inverters Enabled by Ultrathin Cross-linked Polymers as Gate Dielectrics," *J. Am. Chem. Soc.*, 2005: 127, 10388-10395.

* cited by examiner

*Primary Examiner*—Randy Gulakowski
*Assistant Examiner*—Olatunde S Ojurongbe
(74) *Attorney, Agent, or Firm*—K&L Gates LLP

(57) ABSTRACT

Dielectric compositions comprising siloxane and polymeric components, as can be used in a range of transistor and related device configurations.

24 Claims, 11 Drawing Sheets

Figure 4A
Figure 4B
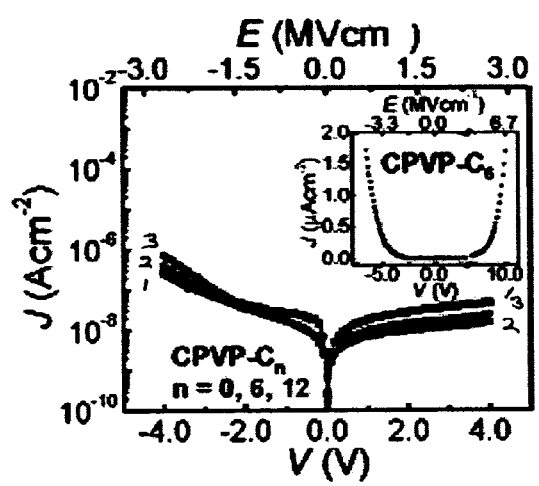
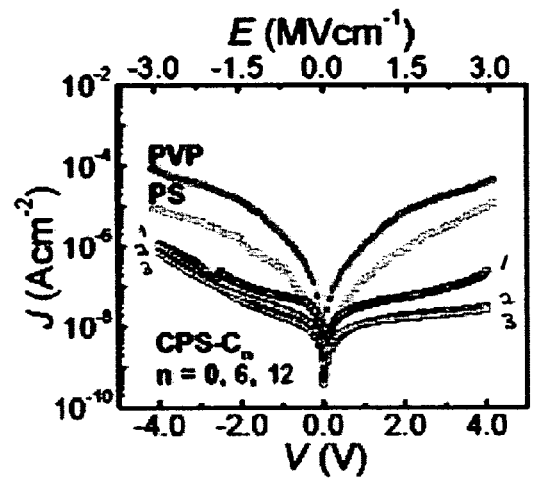
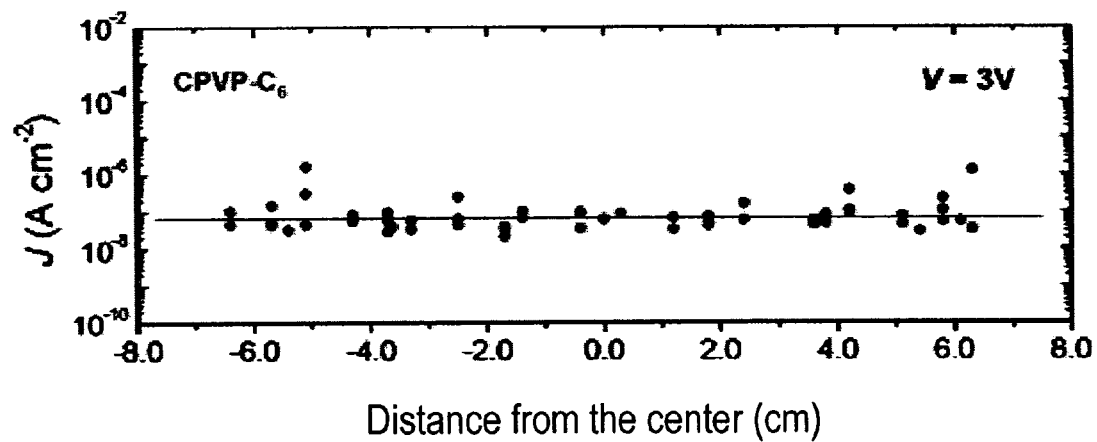
Figure 4C

Figure 5A
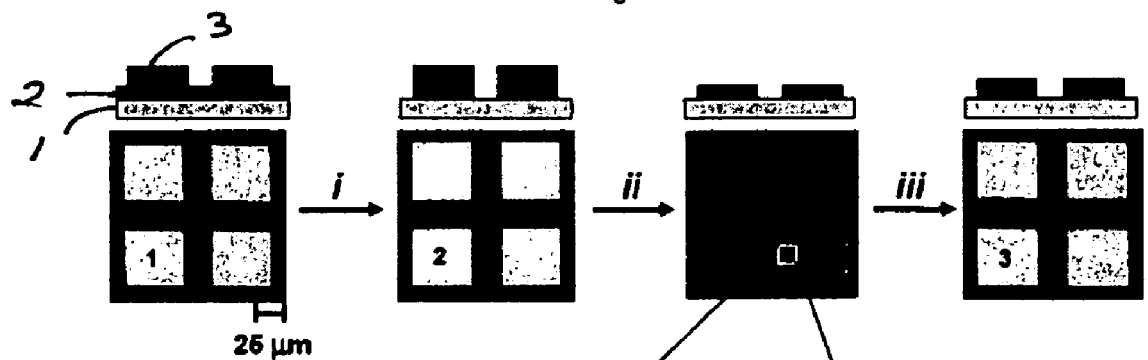
Figure 5B
Figure 5C
Figure 6
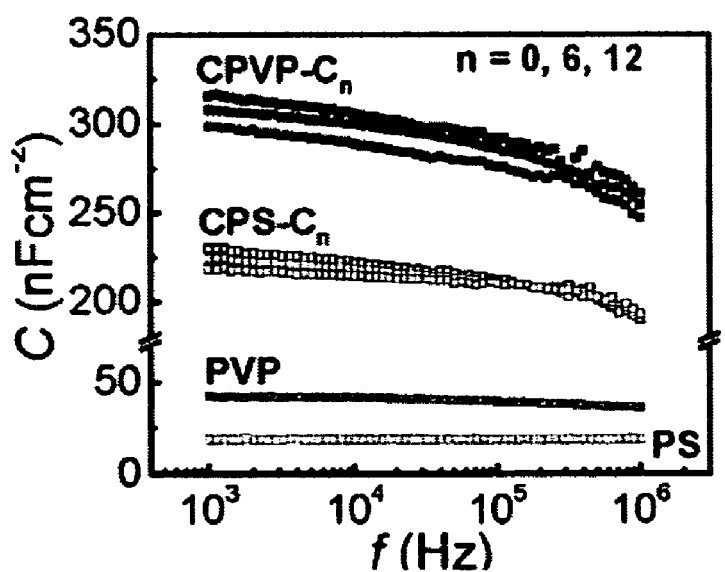

Figure 7A
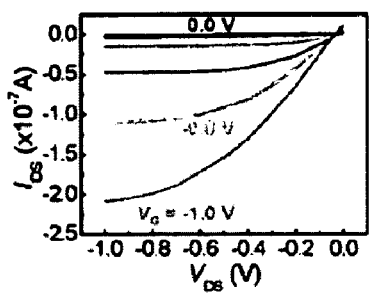
Figure 7B
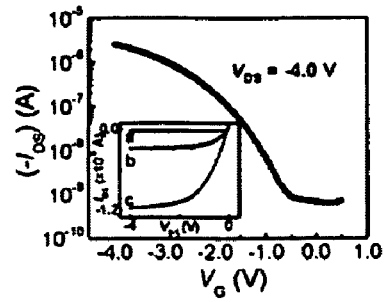
Figure 7C
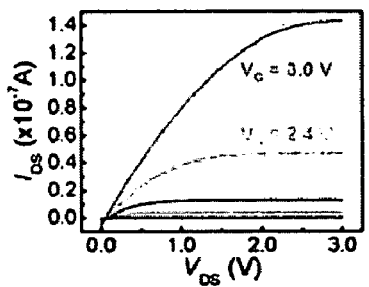
Figure 7D
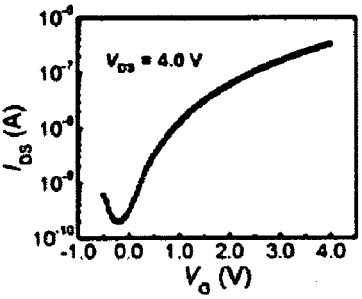
Figure 8A
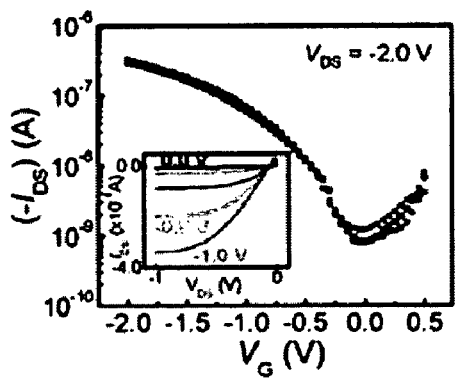
Figure 8B
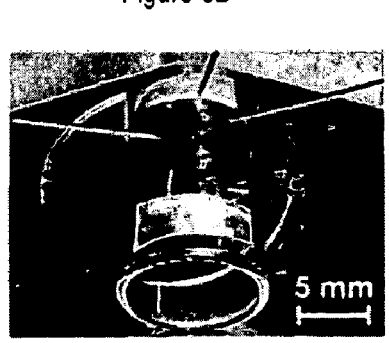
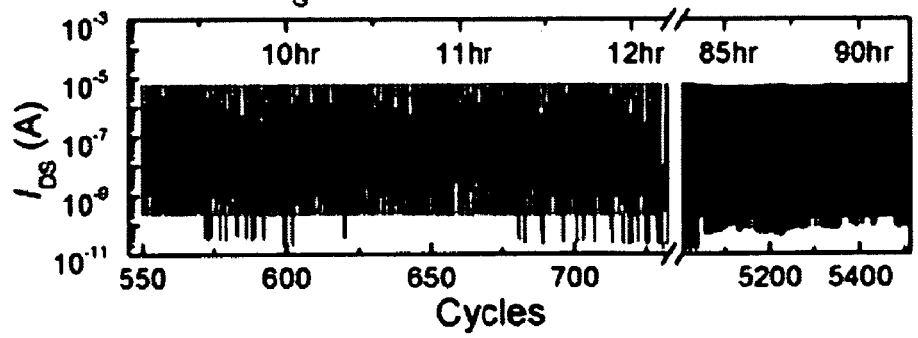
Figure 8C Figure 17
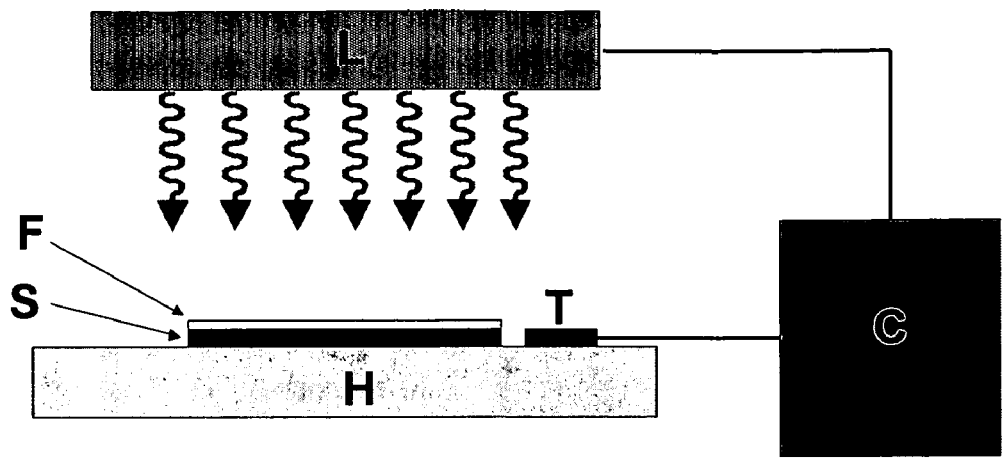
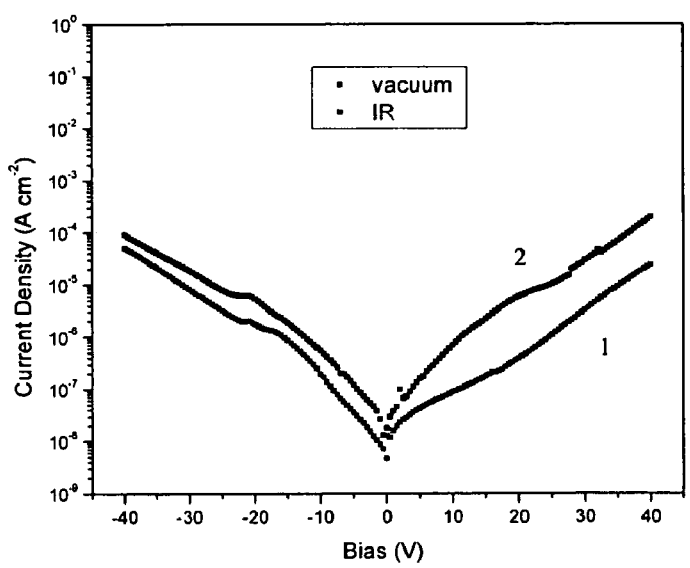
Figure 18

SILOXANE-POLYMER DIELECTRIC COMPOSITIONS AND RELATED ORGANIC FIELD-EFFECT TRANSISTORS

This application claims priority benefit from application Ser. No. 60/638,862 filed Dec. 23, 2004, the entirety of which is incorporated herein by reference.

The United States government has certain rights to this invention pursuant to Grant Nos. N00014-62-0909 (0650-300-F445), DMR-0076097 and NCC 2-3163 from, respectively, the Office of Naval Research, the National Science Foundation and the National Aeronautic and Space Administration to Northwestern University.

BACKGROUND OF THE INVENTION

The quest for high-performance organic thin-film transistor (OTFT) gate dielectrics for is a field of intense current interest. In addition to having excellent insulating properties, such materials must meet key requirements for transition of OTFT technologies to practicality: inexpensive solution/low-temperature fabrication, mechanical flexibility, and compatibility with diverse gate materials and organic semiconductors. The resulting OTFTs should function at low biases to minimize power consumption, hence the dielectric must exhibit large capacitance.

OTFT-based electronic devices performing simple operations/functions offer unique attractions compared to traditional inorganics, including flexibility, light-weight, and inexpensive large-area coverage and integration. Although performance may be reduced compared to Si-based circuits, the aforementioned characteristics make this new technology attractive for enabling diverse new applications. To achieve these goals, OTFT semiconductor and dielectric components should ideally be readily fabricable via high-throughput, atmospheric pressure, solution-processing methods such as spin-coating, casting, or printing. Considerable research effort has targeted the development of solution-processable organic semiconductors, with recent impressive progress. However, the resulting OTFTs are limited by high operating voltages, typically >>10 V, due to the intrinsic low carrier mobilities of the semiconductors and the low capacitances of the dielectrics (typically thick $SiO_2$ and polymer films). One approach to reducing OTFT operating voltages is to employ relatively thick, conventional high-dielectric constant oxide films, however, the vapour-phase deposition processes typically employed (e.g., sputtering) risk damaging organic components and yielding poor mechanical properties on flexible substrates. Furthermore, ultra-thin inorganic insulators are typically electrically "leaky", rendering them incompatible with low-mobility semiconductors. Alternatively, ultra-thin solution-deposited, self-assembled organic mono- and multilayer dielectrics show promise; however, a pathway to efficient integration into large-volume coating processes is less obvious.

Polymers have been considered as gate insulator materials for OTFTs, in view of their ready processability from solution. Polymeric dielectrics such as poly(4-vinylphenol) (PVP), poly(methyl methacrylate) (PMMA), and certain polyimides have been investigated as gate insulators, however only a limited number of organic semiconductors were investigated, with the resulting OTFTs operating only at relatively high voltages. This reflects the substantial insulator thicknesses (usually >>0.3 µm) required to reduce gate leakage currents to acceptable levels, thereby affording low capacitance metrics (typically <<20 nF $cm^{-2}$). An innovative alternative recently reported grows polymeric insulator in situ on the gate surface, and offers, in principle, tunable thickness control. However, reported capacitances are again modest (~3 nF $cm^{-2}$) for low-voltage OTFT applications. The thinnest polymer dielectrics achieved to date (50-100 nm) for polymer-based top-gate OTFTs operate at relatively low voltages (~10 V) with a triarylamine semiconductor. This represents a significant advance, however the polymerization/annealing temperatures are quite high (230-290° C.) and the reported device I-V saturation characteristics not ideal.

BRIEF DESCRIPTION OF THE DRAWINGS

FIGS. 4A-C. Electrical properties of CPVP-(filled symbols) and CPS-(empty symbols) $C_n$ ($C_0$=1, $C_6$=2, $C_{12}$=3) films versus those of neat PVP (green filled symbol)/PS (green empty symbol) films. Note that the voltage axis refers to CPB films only. A. Leakage current density J vs. voltage plots for CPVP-$C_n$ [d (nm)=17 ($C_0$), 14 ($C_6$), 10 ($C_{12}$)] films. Inset: Extended plot for a CPVP-$C_6$ film (13 nm). B. Leakage current density J versus voltage plots for CPS-$C_n$ [d (nm)=12 ($C_0$), 11 ($C_6$), 13 ($C_{12}$)], PVP (133 nm), and PS (122 nm) films. C. Leakage current density J distribution (V=3 V) for a CPVP-$C_6$ film (~24 nm) over a 130 mm Si wafer.

FIGS. 5A-C. Patterning of CPVP-$C_6$ films and corresponding film electrical properties. A. Optical micrographs of a series of pads having the structure depicted above the corresponding image [1=Si substrate; 2=dielectric (23 nm); 3=Au (50 nm)]. Patterning process: i) Dielectric etching with RIE (5 min) or BOE (30 s); ii) Au etching with $I_2$—KI—$H_2O$ (1 min); iii) RIE or BOE, and then Au deposition. B. Leakage current density recorded on the unpatterned (line 1) and patterned (line 2) dielectric on Si and after dielectric removal with RIE (line 3a) and BOE (line 3b). C. AFM line scans of the dielectric step after patterning.

FIG. 6. Capacitance-frequency plots (1-1000 kHz; film thicknesses given in Table 1) for the polymer dielectrics investigated in example 7.

FIGS. 7A-D. Performance of representative TFT devices at low biases with a crosslinked CPVP-$C_6$ gate dielectric layer on an $n^+$-Si gate. A. Current-voltage plot as a function of $V_G$ for DH-6T (p-type). B. TFT transfer plot of current vs. $V_G$ for pentacene (p-type). Inset: $I_{DS}$-$V_{DS}$ plot as a function of $V_G$ (a=0--2.4 V, b=-3.2 V, c=-4.0 V) showing forward (black) and reverse (red) $V_{DS}$ scans. C. Current-voltage plot as a function of $V_G$ for CuFPc (n-type). D. corresponding TFT transfer plot of current vs. $V_G$.

FIGS. 8A-C. Performance of a pentacene TFT device having a CPVP-$C_6$ gate dielectric. A. Transfer plot of current vs. $V_G$ on an Al foil gate before bending (red), after bending 10 times (black), and after bending 30 times (blue). The measurements after bending were carried out on a bent device, with a curvature radius of 7 mm. Inset: Corresponding current-voltage plot as a function of $V_G$. B. Image of the device on an Al foil gate during measurement. Scale-bar denotes 3 mm. C. OTFT operational stability in air driven by square-wave pulses $V_G$=0 V to +2V at 5 Hz ($V_{DS}$=+2 V).

FIG. 17. Schematic of an IR curing setup. C=Temperature controller; L=IR lamp; T=Thermocouple; F=CPB film; S=Substrate; H=Sample holder.

FIG. 18. Comparison of the leakage current densities between 160 nm-thick IR-cured (1) and vacuum oven-cured (2) $CPVP-C_6OAc$ films.

SUMMARY OF THE INVENTION

Figure 1:
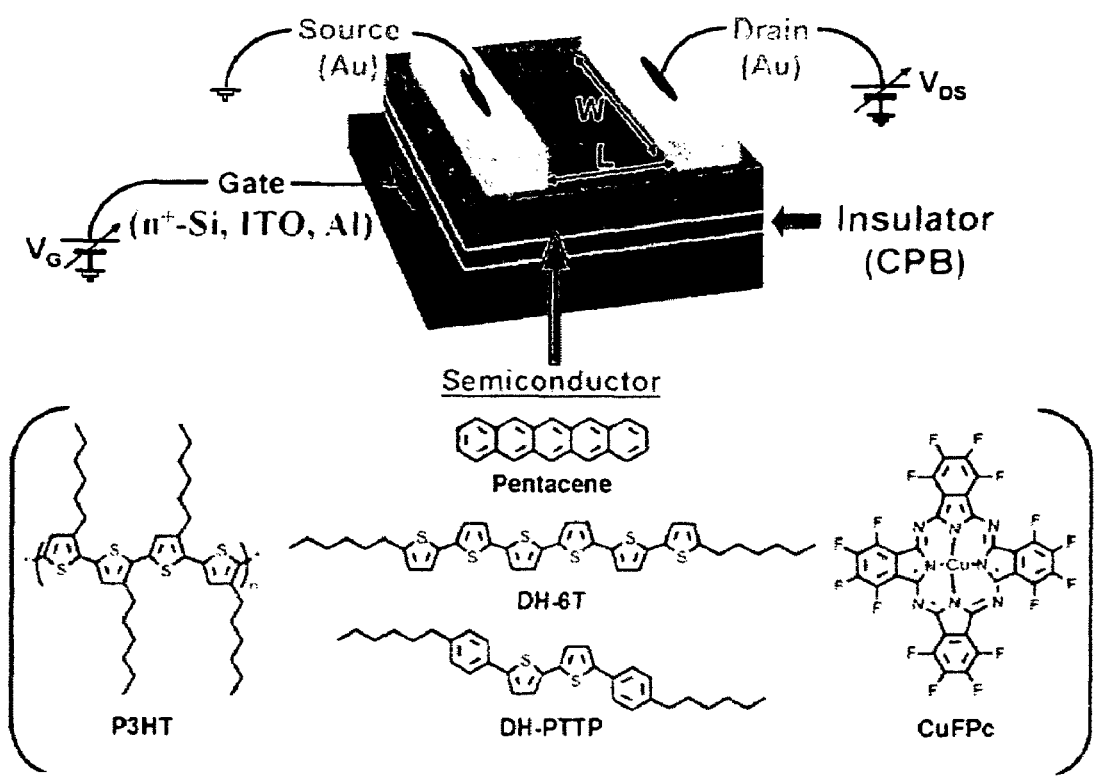
FIG. 1. A schematic of a top-contact OTFT and structure of an organic semiconductor of the type illustrated herein.

In light of the foregoing, it is an object of the present invention to provide dielectric compositions, related composites and/or associated devices, thereby overcoming various deficiencies and shortcomings of the prior art, including those outlined above. It will be understood by those in the art that one or more aspects of the invention can meet certain objectives, while one or more other aspects can meet certain other objectives. Each objective may not apply equally, in all its respects, to every aspect of this invention. As such, the following objects can be viewed in the alterative with respect to any one aspect of the invention.

It can be an object of the present invention to provide a range of organic compositions providing suitable dielectric constants and capacitance sufficient to provide low-voltage OTFT device operation without resort to thick films of the prior art.

It can be another object of the present invention to provide thin films of such compositions, at nanometer dimensions less than currently available using polymer dielectrics of the prior art, such that devices with low current leakage and good saturation characteristics are available through facile fabrication techniques.

It can also be an object of the present invention to provide one of more compositions, in conjunction with one or more of the preceding objectives, useful with a variety of known or otherwise useful semiconductor materials, in a range of OTFT and related device configurations.

Other objects, features, benefits and advantages of the present invention will be apparent from this summary and the following descriptions of certain embodiments and will be readily apparent to those skilled in the art having knowledge of various dielectric compositions, components or related devices. Such objects, features, benefits and advantages will be apparent from the above as taken into conjunction with the accompanying examples, data, figures and all reasonable inferences to be drawn therefrom, alone or with consideration of the references incorporated herein.

In part, the present invention can comprise a dielectric composition comprising a siloxane component and a polymeric component, the composition comprising a structure of a formula $(A)_{3-m}[(O)_{3-m}(y)_m Si(Z)Si(Y')_{m'}(O)_{3-m'}](A')_{3-m'}$ wherein Z can be a moiety selected from O and $(CH_2)_n$, and n can range from 1 to about 20; Y and Y' can be independently selected from H and alkyl, and m and m' can independently range from 0-2; and A and A' can be independently selected from the silyl moiety of at least one of another of such a siloxane component, at least one of such a polymeric component, and combinations thereof. For instance, without limitation, one of A and/or A' can be a polymeric component. Where at least one of A and A' is a polymeric component, such a structural entity can provide a crosslink therebetween. As a non-limiting alternative, one of A and/or A' can be a silyl moiety of at least one of another siloxane component and can provide a network or matrix for a polymeric component mixed, blended and/or incorporated therein.

In certain embodiments, such a siloxane component can crosslink a polymeric component selected from a poly(alkylene), a poly(alkylene) comprising a pendent phenyl moiety and a combination of such components. Alternatively, in certain other embodiments, such a composition can be considered as comprising a condensation product of a polymeric component selected from a poly(vinylphenol), a copolymer of a poly(vinylphenol), a poly(vinylalcohol), a copolymer of a poly(vinylalcohol) and combinations thereof; and a bis (silylated) component of a formula $(X)_{3-m}(Y)_m Si(Z)Si(Y')_{m'}(X')_{3-m'}$, where Z can be a moiety selected from O and $(CH_2)_n$, and n can range from 1 to about 20; X and X' can be independently selected from halide, amino, alkoxy and carboxylate groups, and combinations thereof; Y and Y' can be independently selected from H and alkyl; and m and m' can independently range from 0-2.

In certain embodiments, such a siloxane component can comprise a matrix, where A and A' can independently comprise a silyl moiety of another siloxane component. Alternatively, in certain other embodiments, such a composition can be considered as comprising a self-condensation product of a bis(silylated) compound of a formula $(X)_{3-m}(Y)_m Si(Z)Si(Y')_{m'}(X')_{3-m'}$, where Z of each compound can be a moiety independently selected from O and $(CH_2)_n$, and n can range from 1 to about 20; X and X' can be independently selected from halide, amino, alkoxy and carboxylate groups, and combinations thereof; Y and Y' can be independently selected from H and alkyl; and m and m' can independently range from 0-2. Such a matrix component can have mixed, blended or incorporated therein a polymeric component selected from a poly(alkylene), a copolymer of a poly(alkylene), polystyrene, a copolymer of a polystyrene and combinations thereof.

Regardless, any dielectric composition of this invention can comprise a metal oxide component blended, mixed and/ or incorporated therein. Such a component, whether or not particulate in form or configuration, can comprise a metal component selected from a Group III metal, a Group IV metal, a transition metal, or combinations thereof. Such components, representative embodiments of which are illustrated elsewhere herein, are limited only by desired dielectric constant and/or improved insulator function of any associated composition or device structure. Without limitation, such components can include various binary, ternary and/or quaternary metal oxides, representative examples of which are provided elsewhere herein.

Regarding such a siloxane component, and as can also apply to a silyl component of the sort discussed below, Z can comprise any moiety linking two or more hydrolyzable silyl groups. Various other linking moieties (e.g., branched alkyl and/or substituted alkyl such as but not limited to perfluoroalkyl) will be recognized in the art, such moieties limited only by structure or functionality precluding intra- or intermolecular siloxane bond and/or matrix formation of the sort discussed herein. The range of the hydrolyzable silyl groups will be known by those skilled in the art made aware of this invention, and include but are not limited to groups such as trialkoxysilyl, trihalosilyl, dialkoxyhalosilyl, dihydro- or dialkylhalosilyl, dihaloalkyl(or hydro)silyl and dihaloalkoxysilyl. Various other hydrolyzable silicon substituents include, without limitation, acetoxy, methylamine and higher homologs thereof—one or more of which can be used alone or in conjunction with one or more other hydrolyzable silicon substituents. In certain non-limiting embodiments, a bis(silylated) component can comprise an unsubstituted or substituted alkyl moiety ranging from about $C_3$ to about $C_{14}$, linking two trihalosilyl groups, two trialkoxysilyl groups, two triacetoxysilyl groups or a combination thereof. As discussed more fully herein, such groups are hydrolyzable to a degree sufficient for substrate sorption or condensation or intra- or intermolecular crosslinking via siloxane bond formation under the processing or fabrication conditions employed.

Regardless, the polymeric component of such compositions can be selected from a range of such dielectric polymers otherwise used in the art as separate gate insulator materials or layers in OTFT fabrication. The compositions of this invention are limited only by the availability of suitable silylated components and polymeric dielectric components, the chemistry, mixture or miscibility thereof one with another for device fabrication, and the resulting polymer-incorporated siloxane-bonded matrix/network and corresponding dielectric/insulator function.

In part, the present invention can also be directed to a composite comprising (1) any dielectric composition in accordance with the foregoing, and (2) a substrate component and/or an organic semiconductor component. In certain applicable embodiments, a substrate component can be selected from but not limited to a doped silicon, an indium tin oxide (ITO), an ITO-coated glass, an ITO-coated mylar, aluminum and the like. Where applicable, semiconductor components can be selected from but are not limited to various fused heterocycles, polythiophenes, fused aromatics and other such semiconductor compounds or materials, whether p-type or n-type, otherwise known or found useful in the art. Accordingly, one or more composites of this invention can be embodied within an OTFT device. While a dielectric composition/insulator component of such a device can be provided over a wide dimensional range and in conjunction with various device configurations, several benefits and advantages associated with this invention can be realized with such a dielectric/insulator composition or component, which can have a dimension ranging from less than about 20 nm to about 1 μm or greater in some embodiments, or ranging from about 10 nm to about 20 nm in certain other embodiments.

DETAILED DESCRIPTION OF CERTAIN EMBODIMENTS

Figure 2:
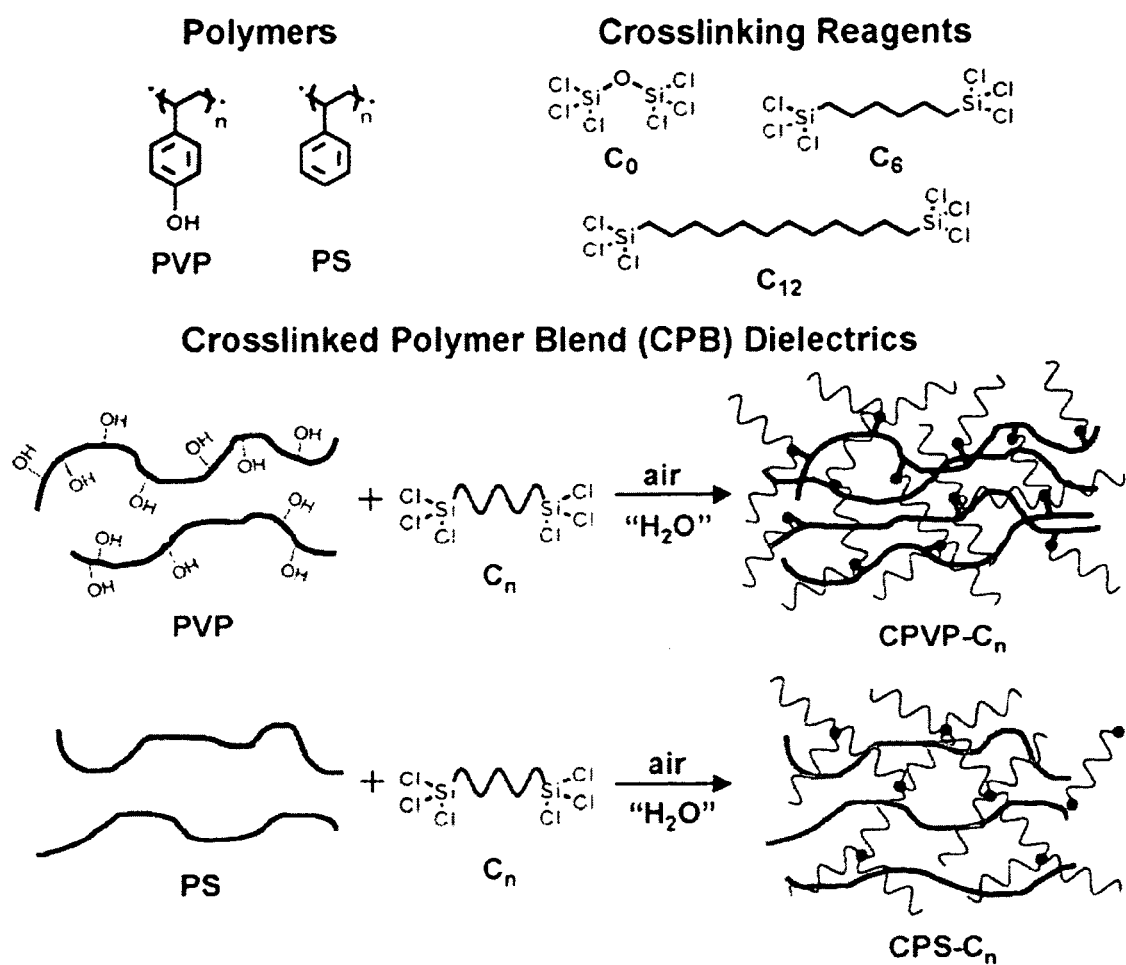
FIG. 2. Chemical structures of several non-limiting, representative polymer and siloxane crosslinkers employed, and schematic representation of an associated dielectric fabrication process.

The present invention demonstrates a new approach to high-quality crosslinked polymer dielectrics, as can be used in conjunction with the fabrication of OTFTs from readily synthesized or commercially available polymer/molecular precursors. See, FIG. 1 for a representative OTFT device configuration and corresponding function. In a top-contact TFT, source and drain electrodes (e.g., Au, 50 nm) are defined on top of the organic semiconductor whereas in a typical bottom-contact device (not shown) electrodes are patterned on the dielectric layer before depositing the semiconductor (typically 50 nm). The insulating layer a crosslinked polymer blend, CPB, of this invention; 10-20 nm, (see FIG. 2 for structure) can be spin-coated on top of the gate substrate. A thicker dielectric layer can be deposited depending on desired k value and device structure. In both top- and bottom-contact configurations, the current flow between source and drain electrodes ($I_{DS}$) on application of a drain-source bias ($V_{DS}$) is modulated by bias applied between gate and source electrodes ($V_G$). When $V_G=0$, $I_{DS}$ is minimal and the device is in the "off" state. When $V_G \neq 0$ is applied, the devices turns "on", and charge carriers are accumulated at the semiconductor-dielectric interface, resulting in a gate-controlled $I_{DS}$. TFT figures-of-merit include field-effect mobility (μ) and current on/off ratio ($I_{on}:I_{off}$), defining the average charge carrier drift velocity and drain-source current ratio between "on" and "off" states, respectively. $I_{DS}$ in saturation ($V_{DS} > V_G$) is then expressed by $$I_{DS} = \frac{W}{2L}\mu C_i [V_G - V_T]^2, \quad \text{(Eq. 1)}$$

where W (here, 100 μm) and L (here, 5 mm) are the TFT channel width and length, respectively, $V_T$ the threshold voltage, and $C_i$ the insulator capacitance per unit area expressed by $$C_i = \varepsilon_0 \frac{k}{d}$$

(Eq. 2 where k is the dielectric constant, $\varepsilon_0$ is the vacuum permittivity, and d is the insulator thickness). Note that for a given device geometry and semiconductor, equivalent current gains ($I_{DS}$) can be achieved at lower operating biases by increasing $C_i$.

The nature of the crosslinking chemistry ensures that subsequent device layers can be spin-coated or printed thereon without dissolution of the dielectric and that the dielectric is covalently bonded or otherwise coupled to the surface of a gate material. The compositions of this invention, as can in certain embodiments have a thickness dimension from about less than 10 to about 20 nm and up to 1 μm or more, exhibit the largest capacitances and lowest leakage currents (considering the thickness range) achieved to date for polymer gate OTFTs, as well as afford devices with extremely low operating biases. Moreover, this approach is applicable to a diverse variety of gate and semiconductor materials.

More specifically, in certain embodiments, this invention provides new spin-coatable, ultra-thin (<20 nm) crosslinked polymer dielectrics exhibiting excellent insulating properties (leakage current densities as low as $10^{-9}$ Acm$^{-2}$) in the fabrication of low-voltage OTFTs. For example, spin-coating a solution of PVP and 1,6-bis(trichlorosilyl)hexane, followed by curing, results in crosslinked films exhibiting large capacitance (~300 nF cm$^{-2}$), insolubility in common solvents, and adhesion to/compatibility with n+-Si, indium tin oxide, and Al gates as well as with a wide range of p- and n-type organic semiconductors.

Figure 15:
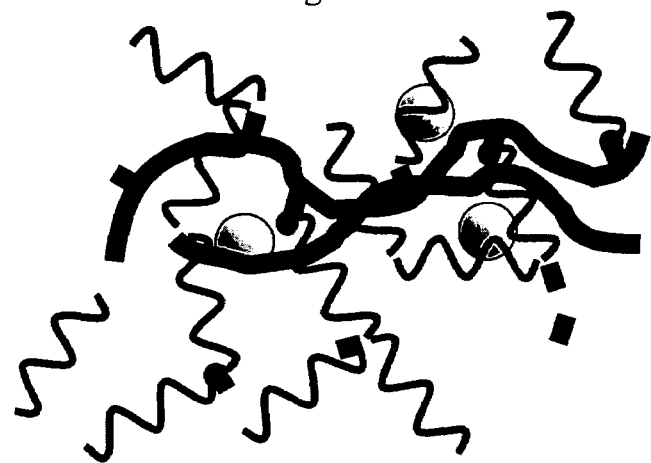
FIG. 15. General schematic structure of high-k nanoparticle-embedded CPB.

The new crosslinked polymer blend compositions described herein (see, e.g., FIG. 2 and FIG. 15) can be prepared by spin-coating of a solution of an appropriate polymer and an α,ω-bis(trichlorosilyl) crosslinking reagent according to procedures described in the following examples, resulting in films dimensioned over the aforementioned ranges, as established by profilometry. Fabrication can be performed in air in a simple fume hood, with resulting films typically cured at ~100° C. for a time which depends on the spin-coating solvent (e.g., as short as 5-10 min for THF). Silane hydrolysis/condensation/crosslinking occurs within seconds after deposition in ambient. Such a process can be optimized by using controlled-atmosphere conditions during film casting and annealing. Films of greater thicknesses, if desired or required, can be obtained simply by 1) multiple spin-on depositions, as a dielectric composition of this invention, also before curing, are stable to and not adversely affected by precursor or processing solutions; or 2) adjusting and/or increasing polymer precursor concentration(s).

EXAMPLES OF THE INVENTION

The following non-limiting examples and data illustrate various aspects and features relating to the compositions, composites and/or devices of the present invention, including the preparation of dielectric siloxane-polymeric compositions, as are available through the techniques and fabrication methods described herein. In comparison with the prior art, the present compositions, composites and/or devices provide results and data which are surprising, unexpected and contrary thereto. While the utility of this invention is illustrated through the use of several compositions and components thereof, it will be understood by those skilled in the art that comparable results are obtainable with various other compositions and their corresponding components, as are commensurate with the scope of this invention.

Materials and cleaning. Poly(4-vinylphenol) (PVP, $M_w$=8-20K) and polystyrene (PS, $M_w$=0.5-2M) were purchased from Aldrich or other known suppliers and used without further purification. Hexachlorodisiloxane and 1,6-bis (trichlorosilyl)hexane were purchased from Acros and Gelest, respectively, and purified by distillation. The reagent 1,12-bis(trichlorosilyl)dodecane was synthesized by hydrosilylation of commercially available 1,11-dodecadiene. Highly n-doped silicon wafers were obtained from Montco Silicon Tech and cleaned according to standard procedures (sonication in organic solvent, Pirahna solution, oxygen plasma treatment) before use. ITO-coated glass substrates (≦30 Ω/sq) were purchased from Thin Film Devices and cleaned by 30 min sonication in aqueous detergent solution, acetone, isopropanol and methanol, successively. Aluminum substrates were cut from commercially available aluminum foil (Reynolds Customer Products). ITO-glass, ITO-Mylar, and aluminum foil substrates were cleaned with an oxygen plasma before use. Pentacene, copper hexadecafluorophthalocyanine (CuFPc), and regioregular poly(3-hexylthiophene) (P3HT) were purchased from Aldrich. α,ω-dihexylsexythiophene (DH-6T) and α,ω-dihexylsexy, bis(n-hexylphenyl)bithiophene (DH-PTTP) are available as described in the literature and the incorporated references.

Electrical measurements. All OTFT measures were carried out in air using a Keithly 6430 semfemtoammeter and a Keithly 2400 source meter, operated by a local Labview program and GPIB communication. Triaxial and/or coaxial shielding was incorporated into Signaton probe stations to minimize the noise level. A digital capacitance meter (Model 3000, GLK Instruments) and HP4192A Impedance Analyzer were used for capacitance measurements.

Example 1

Dielectric coating. Using the aforementioned CPB designation, for crosslinked PVP, CPVP-$C_n$ (n=0, hexachlorosiloxane; 6, 1,6-bis(trichlorosilyl)hexane; 12, 1,12-bis(trichlorosilyl)dodecane)), PVP (4 mg/mL in anhydrous THF) was mixed with the trichlorosilyl reagent (4 mg/mL in anhydrous THF) in a 1:1 volume ratio and then spin-coated onto freshly oxygen plasma-treated Si (ITO-glass, ITO-Mylar, or Al) substrates at 5000 rpm (acceleration 60), and then cured in vacuum oven at 100-110.degree. C. for 5-10 min. For crosslinked polystyrene (PS), CPS-$C_n$, polystyrene (Mw=1M; 7 mg/mL in anhydrous toluene) was mixed with the trichlorosilyl reagent in anhydrous toluene in a 1:1 volume ratio, was then diluted with 2 parts of toluene, and then spin-coated onto substrates at 4000 rpm (acceleration 60), and cured in vacuum oven at 100-110° C. overnight. PVP-only and PS-only films for capacitance measurements were spin-coated from 20 mg/mL THE and toluene solutions, respectively, at 2500 rpm and were dried in vacuum oven at 100-110° C. for .about.2 h. Various other compositions of this invention can be prepared using one of a range of polyacrylates and polyimides, together with a poly(silylated) component. For instance, a range of bis(silylated) components can be prepared from commercially-available dienes using hydrosilylation techniques of the sort described in co-pending application Ser. No. 10/924,730 filed Aug. 24, 2004, the entirety of which is incorporated herein by reference.

Example 2

Device fabrication. For OTFTs, organic semiconducting materials were vacuum deposited at ~2×10$^{-6}$ Torr (500 Å, 0.2 Å/s) while maintaining the substrate temperature at 60° C. Films of P3HT, for instance, were spin-coated from a dry toluene solution (1 weight %, 2000 rpm) at RT. Gold electrodes for OTFT/MIS/MIM devices were vacuum-deposited through shadow masks at 3-4×10$^{-6}$ Torr (1000 Å, 0.5 Å/s). Regardless of device configuration, the compositions of this invention can be used with a range of other semiconductor materials known in the art, including but not limited to, n-type and p-type polythiophene compounds of the sort described in U.S. Pat. No. 6,585,914, the entirety of which is incorporated herein by reference.

Example 3

To assess the influence of differing CPB structures (FIG. 2) and to highlight the effects of polymer microstructure and crosslinker on dielectric film properties, two polymers, PVP and PS, and three crosslinkers, hexachlorodisiloxane ($C_0$), 1,6-bis(trichlorosilyl)hexane ($C_6$), and 1,12-bis(trichlorosilyl)dodecane ($C_{12}$), were investigated. The crosslinked films, denoted CPVP—$C_n$ and CPS-$C_n$, where PVP and PS indicate the respective polymer reagents, are structurally quite different. In CPVP-$C_n$, PVP chains are δ-bonded to a siloxane network whereas for CPS-$C_n$, PS chains are simply embedded in the crosslinked matrix. As shown by the film metrics of Table 1, below, this affords materials with substantially different properties, which are compared and contrasted with those of neat PVP and PS films of similar/greater thicknesses, and which are characterized here by atomic force microscopy (AFM) as well as metal-insulator-metal (MIM) and metal-insulator-semiconductor (MIS) leakage and capacitance measurements.

TABLE 1

Summary of the dielectric (10 kHz) and film properties of polymeric dielectrics.

| Dielectric | Film Thickness[a] (nm) | RMS Roughness[a] (nm) | $C_i$[b] (nF cm$^{-2}$) | $\epsilon$[c] |
|---|---|---|---|---|
| CPVP-C$_0$ | 18 | 6-8 | 305 | 6.2 |
| CPVP-C$_6$ | 18 | 2 | 300 | 6.1 |
| CPVP-C$_{12}$ | 20 | 6 | 289 | 6.5 |
| CPS-C$_0$ | 12 | 8-10 | 220 | 3.0 |
| CPS-C$_6$ | 10 | 1.5 | 218 | 2.5 |
| CPS-C$_{12}$ | 13 | 5 | 200 | 2.9 |
| PVP | 133 | 6 | 42 | 6.4 |
| PS | 122 | 2 | 19 | 2.6 |
| SiO$_2$[d] | 300 | 2 | 11 | 3.9[e] |

[a]Measured on Si substrates (substrate rms roughness ~0.5 nm).
[b]Measured on MIS structure.
[c]Calculated from Eq. 2.
[d]From commercial source.
[e]Literature value.

Example 4

Figure 3:
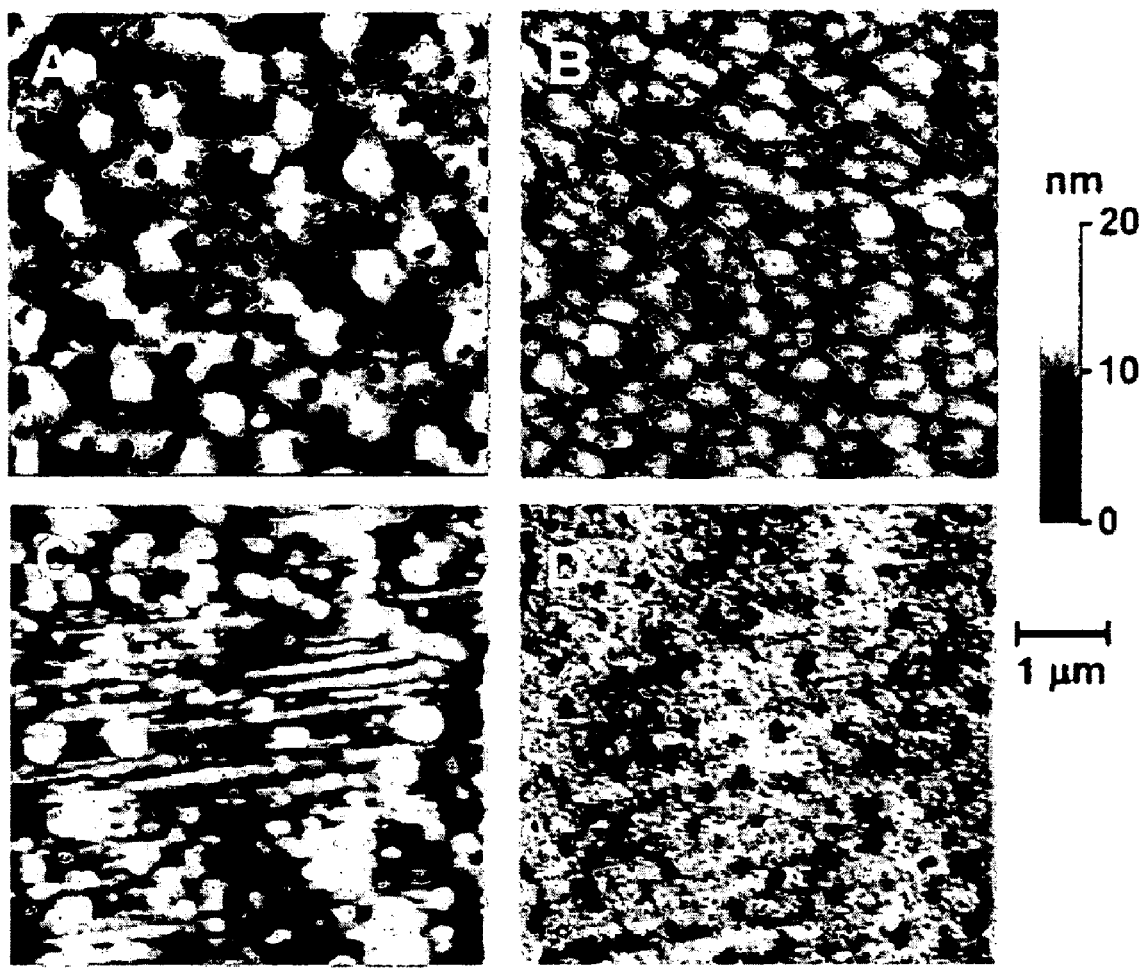
FIGS. 3A-D. Contact mode AFM images (5×5 µm scan area) for evaluation of film morphology and substrate/insulator surface quality. A. CPVP-$C_0$. B. CPVP-$C_6$. C. Kitchen Al foil. D. Al foil after three consecutive CPVP-$C_6$ depositions.

AFM micrographs of the CPB films reveal that surface morphology is more dependent on crosslinking reagent than on the polymer structure (FIG. 3). Since a smooth dielectric-semiconductor interface is a prerequisite for efficient charge transport in the TFT channel, the AFM data provide important information for initial materials screening and evaluation. The CPVP-C$_0$ and CPS-C$_0$ AFM images exhibit very rough surfaces, having a large density of grains and flakes, with a rms roughness of 6-10 nm (FIG. 3A). In contrast, CPB films crosslinked with C$_6$ are far smoother, exhibiting a rms roughness of ~1.5-2 nm (FIG. 3B). These films exhibit no evidence of major defects or pinholes. Note also that thin/thick neat PVP and PS films are also very smooth. However, close examination reveals that regions of significant smoothness are accompanied by major pinholes which will inevitably compromise dielectric performance. The CPS-C$_{12}$ films are somehow rougher than CPVP-C$_6$ and CPS-, possibly because the longer C$_{12}$ chains aggregate in the solvents used for spin-coating, resulting in grainy films after crosslinking. The greater roughness of the CPVP-C$_0$ and CPS—C$_0$ films is most likely the combined result of the greater moisture sensitivity of C$_0$, compared to the corresponding α,ω-alkane-linked chlorosilanes (C$_6$ and C$_{12}$), resulting in rapid crosslinking as well as absence of a "flexible" linker between the silyl termini, yielding a less flexible siloxane network. Note that CPVP-C$_6$ and CPS-C$_6$ also planarize very rough substrates such as commercial kitchen Al foil or glass. For example, the rms roughness of commercial Al substrates (FIG. 3C), ~11-14 nm, is reduced to ~4-6 nm after depositing a ~60 nm-thick CPVP-C$_6$ film (FIG. 3D).

Example 5

The dielectric characteristics of the crosslinked dielectric films were evaluated via quantitative leakage current and capacitance measurements. FIG. 4 shows typical current density-electric field (J-E) plots for MIS structures fabricated with CPB and PVP/PS insulators, demonstrating that these ultra-thin crosslinked materials exhibit superior insulating properties vs. the corresponding neat polymers of greater thicknesses. The leakage current densities for CPVP-C$_n$ and CPS-C$_n$ films (d=10-20 nm) are $10^{-7}$-$10^{-8}$ A cm$^{-2}$ up to E~2 MV cm-1 (±3V) compared to $10^{-4}$-$10^{-7}$ A cm-2 (E~2 MV cm$^{-1}$) for PVP and PS films (d=120-130 nm). The former metrics are also substantially lower than those of a several hundred nm-thick melamine-crosslinked PVP films and are comparable to those of μm-thick polymer dielectric and of far thicker oxide films. Furthermore, FIG. 4C demonstrates that CPB films of excellent electrical uniformity can be deposited by the present procedure over a 13 cm diameter Si wafer, with average leakage current densities for a CPVP-C$_6$ film (~24 nm) of 9.8±2.3×10$^{-8}$ A cm$^{-2}$ (V=3 V) when sampling 60 wafer locations.

Furthermore, the CPVP-C$_n$ films strongly adhere to substrates, do not undergo delamination/cracking on substrate bending or solvent treatment (e.g., 30 sec ultrasonic treatment in common organic solvents) in accord with the highly crosslinked microstructure. Leakage currents, capacitances, and OTET characteristics (vide infra) are invariant to solvent exposure, demonstrating potential for subsequent solution-phase processing/fabrication steps. In contrast, partial delamination or complete dissolution is observed for CPS-C$_n$ and PVP or PS films, respectively.

Example 6

Despite excellent adhesion and solvent resistance, CPVP-C$_n$ films can be conveniently patterned as required for via formation using conventional lithography and reactive ion etching (RIE) or buffer oxide etching (BOE). FIG. 5A shows an image of shadow-mask fabricated Au pads (3) on a CPVP-C$_6$/Si substrate (2 on 1). After dielectric removal from the exposed areas (FIG. 5B), the resulting patterned MIS structures exhibit leakage current densities comparable to those of unpatterned areas (FIG. 5B), demonstrating that RIE/BOE patterning does not alter the quality of the underlying dielectric layer. After Au removal, the optical image clearly shows the patterned dielectric region, while profilometry and AFM (FIG. 5C) demonstrate that the thickness of the dielectric is unchanged. Finally, Au pad deposition in regions where the dielectric layer was removed demonstrate formation of excellent electrical contacts to the bottom (gate) with J increased >6 orders of magnitude versus those in MIS structures (FIG. 5B).

Example 7

To measure the capacitances, dielectric constants, and loss factors for the new dielectric films as a function of AC driving frequency ($10^3$-$10^6$Hz), capacitance-voltage ($C_i$-V) and capacitance-frequency ($C_i$-f) measurements were performed on MIS (M=Au, S=n+-Si) and MIM (M=ITO, Au) structures. Both structures provide quantitatively similar results. Representative $C_i$-f plots are shown in FIG. 6 and data are collected in Table 1. These data demonstrate that the CPB materials exhibit very large capacitance values [$C_i$(CPVP-C$_n$)~300 nFcm$^{-2}$, Ch$_i$(CPS—C$_n$)~225 nFcm-2; +5% at $10^3$ Hz], far greater than 300 nm-thick SiO$_2$ dielectrics typically used for OTFTs (~10 nFcm$^{-2}$). In contrast, the capacitance of thin PVP and PS films (<20 nm, not shown) cannot be measured due to large leakage currents, and the capacitance values of 130 nm-thick films (which are still too leaky for practical OTFT use, see FIG. 4B) are substantially lower (Table 1). Note that CPB $C_i$ values are reproducible and very stable with time, indicating in contrast to PVP, CPB polymers are minimally hygroscopic. Breakdown fields are between 3-6 MVcm$^{-1}$(see inset FIG. 4A for CPVP-C$_6$) depending on the CPB structure and voltage scan direction. The formal dielectric constants calculated using Eq 2, are 6.1-6.5 and 2.5-2.9 (10 kHz) for CPVP-$C_n$ and CPS-$C_n$ films, respectively. These values are reasonable considering that the reported dielectric constants of PVP and PS are .about.3.6-8 and .about.2.5, respectively—close to values independently measured in this study (6.4 and 2.6, respectively). The loss factors for the current dielectrics are also reasonably low (<0.1 at $10^4$ Hz) and can be improved with optimized processing.

Example 8

All of the CPB films examined exhibit little hysteresis in the $C_i$-V plots, suggesting that the concentration of positive fixed charges is very low. Typical hysteresis shifts are <0.1 V and <0.5 V for CPVP-$C_n$ and CPS-$C_n$, respectively. Note that all of the dielectric metrics reported here were obtained for films fabricated from commercially available polymers. Polymer purification, design/blending of different (co)polymers, and film fabrication in a dust-free environment can improve and/or alter performance. From the aforementioned morphology and dielectric data it is clear that CPVP-$C_6$ exhibits attractive features in terms of large capacitance, low leakage currents, and smooth morphology. Since such films are readily accessible from commercially-available precursors, CPVP-$C_6$ was used extensively in OTFT fabrication and testing, as a representative composition of this invention.

Example 9

The principal TFT structures investigated in this study utilized dielectric CPVP-$C_6$ and, for comparison, CPS-$C_6$, spin-coated on the gate, followed by semiconductor and Au source-drain contact deposition (top-contact TFT). Devices fabricated on $n^+$-Si substrates were used to demonstrate compatibility of the crosslinked polymers with a variety of semiconductors, whereas pentacene OTFTs were investigated to demonstrate compatibility of these insulators with many gate materials in both top- and bottom-contact geometries. To demonstrate semiconductor generality, a variety of molecular and polymeric p-(hole transporter) and n-(electron-transporter) channel semiconductors were selected (structures in FIG. 1), the films of which were deposited by either vapour- or solution-processing methods. FIG. 7 shows typical I-V plots for pentacene (vapour-deposited, p-type) and CuFPc (vapour-deposited, n-type). These data demonstrate that CPVP-$C_6$-based TFTs exhibit excellent linear/saturation characteristics and operate at extremely low voltages (<1 V) due to the large capacitance and low leakage currents of the crosslinked polymer dielectric. Typical laboratory device yields approach 100%.

Example 10

In marked contrast, control devices fabricated with a thicker (300 nm) $SiO_2$ dielectric film require far larger operating voltages for a useful $I_{DS}$. The CPB OTFT data summarized in Table 2 show that carrier mobilities comparable to those of $SiO_2$-based devices, fabricated under the same conditions, are achieved. Moreover, the $V_T$s are now only a fraction/few volts and S parameters are also very low. Note that for ease of comparison, all semiconductor films discussed here were deposited at an identical substrate temperature (~60° C.), which is not necessarily optimum for each semiconductor. Pentacene/CPVP-$C_6$ OTFT devices achieve μ~0.1 $cm^2$ $V^{-1}s^{-1}$ versus ~0.3 $cm^2$ $V^{-1}s^{-1}$ for those with $SiO_2$ dielectrics and $I_{on}/I_{off}$~$10^4$ at VG=4 V. Bottom-contact pentacene TFTs also perform well (Table 3, entry 6). Also, typical n-type semiconductors such as CuFPc behave similarly on CPVP-$C_6$ vs. $SiO_2$ dielectrics with μ~0.005 $cm^2$ $V^{-1}s^{-1}$ and $I_{on}/I_{off}$>$10^3$ (Table 2, entry 5). Note that these TFTs show little hysteresis [$(\Delta I_{DS}/I_{DS})_{max}$<10%)] in $I_{DS}$-$V_{DS}$ plots, confirming the good quality of the dielectric material (Inset FIG. 7B).

TABLE 2

Field effect transistor data for CPVP- and CPS-$C_6$ - based devices with different organic semiconductors and gate substrates.[a]

| | Semicond. | Dielec./Subst. | μ ($cm^2V^{-1}s^{-1}$) | $I_{on}:I_{off}$[b] | $V_T$[d] (V) | S[e] (V/dec.) |
|---|---|---|---|---|---|---|
| 1. | Pentacene | CPVP-$C_6$/$n^+$-Si | 0.1 (0.3) | $10^4$ ($10^5$) | −1.8 (−2.3) | 0.45 (8) |
| 2. | DH-6T | CPVP-$C_6$/$n^+$-Si | 0.1 (0.1) | $10^3$ ($10^4$) | 0.9 (−4) | 0.47 |
| 3. | DHPTTP | CPVP-$C_6$/$n^+$-Si | 0.01 (0.02) | $10^4$ ($10^5$) | −1.2 (−5) | 0.28 |
| 4. | P3HT | CPVP-$C_6$/$n^+$-Si | 4 × $10^{-3}$ (5 × $10^{-3}$) | $10^2$ ($10^3$) | 1.2 (20) | 0.54 (9) |
| 5. | CuFPc | CPVP-$C_6$/$n^+$-Si | 5 × $10^{-3}$ (3 × $10^{-3}$) | $10^3$ ($10^4$) | 0.5 (20) | 0.40 |
| 6. | Pentacene[c] | CPVP-$C_6$/$n^+$-Si | 2 × $10^{-3}$ | $10^3$ | −0.7[c] | 0.63[c] |
| 7. | Pentacene | CPS-$C_6$/$n^+$-Si | 0.08 | $10^4$ | −2.0 | 0.35 |
| 8. | Pentacene | CPVP-$C_6$/ITO-G | 0.01 | $10^3$ | −0.4 | 0.58 |
| 9. | Pentacene | CPVP-$C_6$/ITO-M | 0.06 | $10^4$ | −0.6 | 0.29 |
| 10. | Pentacene | CPVP-$C_6$/Al | 0.03 | $10^3$ | −0.2 | 0.28 |

[a]Data in parentheses are for 300 nm-thick $SiO_2$ devices with the semiconductor films grown under the same condition as for CPVP- and CPS-$C_6$. All TFT mobilities (μ) and threshold voltages ($V_T$) are calculated in the saturation regime.
[b]Calculated at $V_G$ = 0.0 − ±4.0 V (0 − ±100 V) and $V_{DS}$ = ±4.0 V (±100 V).
[c]Data for bottom-contact configuration.
[d]Threshold voltage.
[e]Subthreshold voltage swing (S = $dV_G/d(\log I_{DS})$).

Example 11

Importantly, spin-coating and solution-casting of an additional organic layers does not adversely affect the CPB insulator properties. Thus, TFTs fabricated with P3HT (spin-coated from $CHCl_3$) and DHPTTP (solution-cast from xylene) display good transistor response characteristics at very low voltages (entries 2, 3). Finally, pentacene TFTs having a CPVP-$C_6$ dielectric were fabricated on a variety of substrates, demonstrating broad versatility. Thus, TFTs on ITO-glass (entry 8), ITO-Mylar (entry 9), and kitchen Al foil (entry 10) exhibit excellent response characteristics. For example, Al foil-based devices can be repeatedly bent with negligible degradation of TFT performance (FIG. 8). Finally, note that the aforementioned results are achieved on very large device areas, and more sophisticated material patterning and device structure optimization should additionally improve performance. The remarkable stability of OTFTs fabricated with CPB gate dielectrics (when the semiconductor is itself environmentally stable) is shown in FIG. 8C. Pentacene TFTs can be continuously cycled in air (relative humidity ~80%, T=22-25° C.) between $V_G$=0 and +3 V without detectable "on" current and $I_{on}/I_{off}$ degradation over periods >60 h. This result confirms that the dielectric-semiconductor interface is largely free of reactive groups that can act as charge carrier traps.

Example 12

Figure 9A:
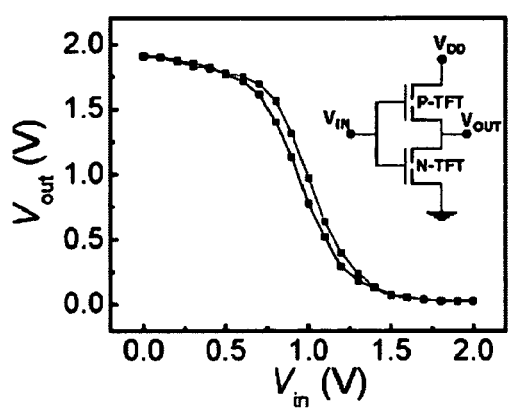
FIGS. 9A-B. Complementary CPB-based inverter using a pentacene TFT (L=100 μm, W=5 mm) and a CuFPc TFT (L=50 μm, W=5 mm). A. Static characteristics measured with increasing (black) and decreasing (red) input voltage ($V_{DD}$ =+2 V). Inset: Schematic electrical connections of the inverter. B. Dynamic switching characteristics of the inverter at 5 Hz. Inset: Dynamic switching characteristics of the inverter at 100 Hz.
Figure 9B:
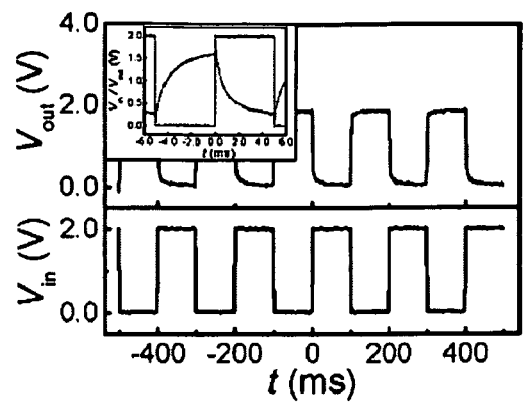

Due to the CPB dielectric robustness and compatibility with both p-and n-type semiconductors, complementary logic is possible. Inverters having pentacene (p-type) and FPcCu (n-type) transistors were fabricated with a common gate as input voltage ($V_{IN}$) and operate at very low voltages (FIG. 9A). Inverter response is clearly observed for switching between logic "1" (−2 V) and logic "0" (0 V) with the small hysteresis reflecting the transistor threshold voltage stability. The voltage gain $dV_{OUT}/dV_{IN}$~3.5 (>1) implies that these devices could be used to switch subsequent stages in more complex logic circuits. These inverters can be switched at frequencies up to ~100 Hz, with τ~2 ms fall time and τ~1 ms rise time (FIG. 9B). Other embodiments can employ higher-mobility n-type materials, patterning the gate electrode (to reduce source-drain-to-gate overlap capacitance), and reducing channel length (the channel length of such a device can be 100 μm, greater than a dimension of 5-10 μm typically used in optimized organic ICs).

Example 13a

The results provided with representative CPVP-$C_n$ and CPS-$C_n$ dielectrics indicate that the presence of OH groups on the polymer backbone can be used to affect material robustness and adhesion. Furthermore, it has been recently reported that groups of type X—OH (X=Si, C) act as electron traps reducing carrier mobility of n-type semiconductors and enhance I—V and Ci—V hysteresis. To approach such issues, regiorandom poly(styrene-vinylphenol), P(S-co-PVP), copolymers were prepared over a range of styrene/vinylphenol ratios and crosslinked with the aforementioned bis(trichlorosilyl) reagent, designated $C_6$. Additional studies were also done with a variety of ethylene-vinylalcohol copolymers, P(E-co-VA). See Scheme 1.

Scheme 1

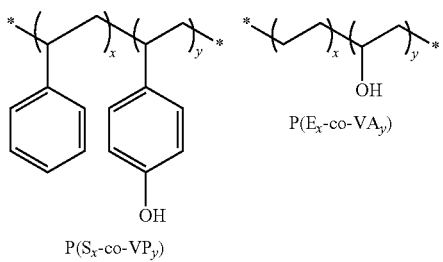

P($S_x$-co-VP$_y$)

P($E_x$-co-VA$_y$)

The use of such copolymers also represent another route for efficient modulation of material dielectric constant: by varying the relative polymer building blocks molar ratio. The results are summarized in Table 3.

TABLE 3

Summary of the co-polymer composition and of the corresponding crosslinked film dielectric properties.

| Dielectric | x:y Ratio | Mn | ε |
|---|---|---|---|
| CP($S_x$-VP$_y$)-$C_6$ | 75:25 | 75000 | 2.8-3.2 |
| | 50:50 | 87000 | 3.6-4.0 |
| | 25:75 | 140000 | 4.2-4.6 |
| CP($E_x$-VA$_y$)-$C_6$ | 44:56 | 10.000-190.000 | 6.3-6.8 |
| | 38:62 | 10.000-190.000 | 6.8-7.3 |
| | 32:68 | 10.000-190.000 | 7.2-7.6 |
| | 27:73 | 10.000-190.000 | 7.6-8.1 |
| | 0:100 | 10.000-190.000 | 9.8-10.2 |

P($S_x$-VP$_y$) copolymers were synthesized according to the literature [Lei Jong; Eli M. Pearce; T. K. Kwei Macromolecules (1990), 23, 5071-5074]; and a range of P($E_x$-VA$_y$) copolymers are commercially available (Aldrich) or can be synthesized according to the literature [Park, Eun-Soo; Kim, Mal-Nam; Yoon, Jin-San. Journal of Polymer Science, Part B: Polymer Physics (2002), 40(22), 2561-2569]. Permittivity was estimated or measured in a MIS structure device, prepared as described herein and known in the art.

Example 13b

Figure 10:
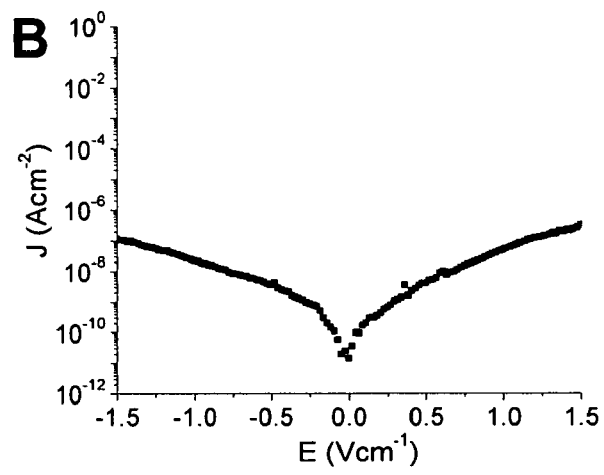
FIG. 10. Leakage current densities for $CP(S_{75}-VP_{25})-C_6$ films.

AFM and I-V leakage current data demonstrate the excellent film quality of the copolymer-based CPB materials. An AFM micrograph of a 22 nm-thick CP($S_{75}$—VP$_{25}$)—$C_6$ film shows a RMS roughness <1 nm. The leakage current density of this sample was <$10^{-7}$ A/cm² at 1.5 MV/cm. (See FIG. 10.) Similar results are obtained for other co-polymers of the preceding example.

Example 13c

Figure 11A:
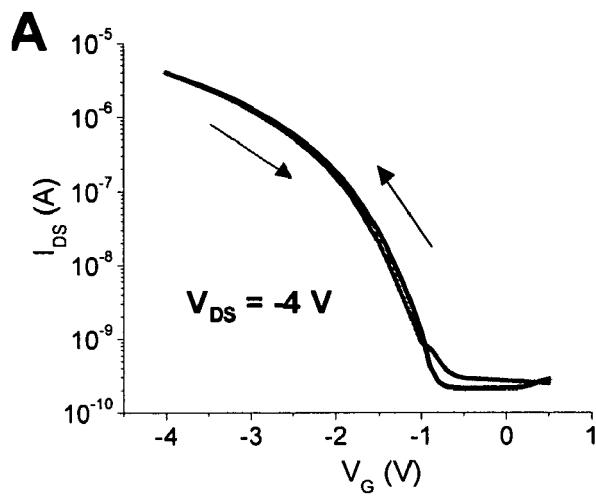
FIGS. 11A-B. Transfer (A) and output (B) plots of a $CP(S_{75}-VP_{25})-C_6$-based pentacene TFT.
Figure 11B:
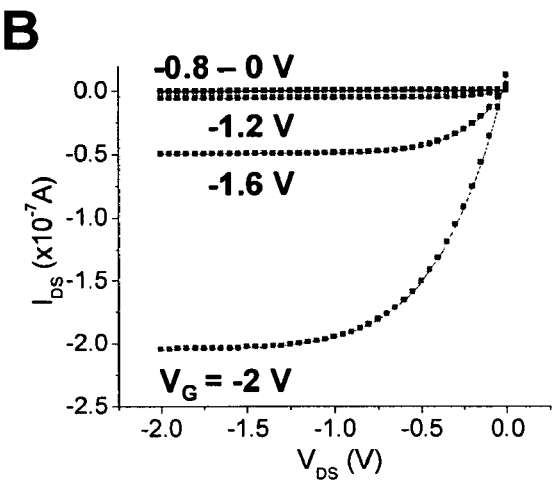

Pentacene OTFTs fabricated with such dielectrics operate at very low voltage and both output and transfer plots show no evidence of hysteresis (FIGS. 11A-B). The carrier mobilities (0.2-0.4 cm²/Vs) and current modulations ($10^4$-$10^5$) measured for these devices are typical when using pentacene.

Example 14a

For deposition of the CPB films via roll-to-roll processes, e.g., in printing methodologies, it can be useful to control the rate of crosslinking in such a way to avoid/prevent formation of the crosslinked matrix in solution before film deposition. Furthermore, long term stability of CPB component solutions before mixing can be of concern when employing highly reactive and moisture-sensitive bis(trichlorosilyl)alkane reagents. Toward these and other objectives, alternate hydrolysable crosslinkers can be used, such as those shown in Scheme 2.

Scheme 2. General formulae of non-limiting alternate silane crosslinkers, where at least one of each silyl-substituted R, $R^1$, $R^2$ and $R^3$ can be, e.g., $C_nH_{2n+1}$ (n = 1 ~ 10).

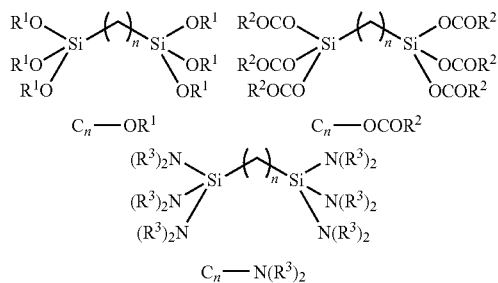

Examples include the bis(acetoxysilyl)alkanes, bis(alkoxysilyl)alkanes, and bis(alkylaminosilyl)alkanes, each of which can be symmetrical or mixed with respect to mono-, di-, and/or tri-silyl substitution. The aminosilyl reagents are relatively inert, yet can readily crosslink. Such systems can be synthesized in excellent yields from the corresponding chloro precursors. Furthermore, using such crosslinkers thicker CPB films can be deposited with low surface roughness. For instance, the acetoxy-based crosslinker $C_6OAc$ [n=6; $R^2$=$CH_3$] can be synthesized according to Scheme 3. An advantage of this compound compared to the corresponding chloro precursor is that the resulting solid can be readily purified by recrystallization from hydrocarbons.

Scheme 3. Synthesis of an acetoxy-based crosslinker.

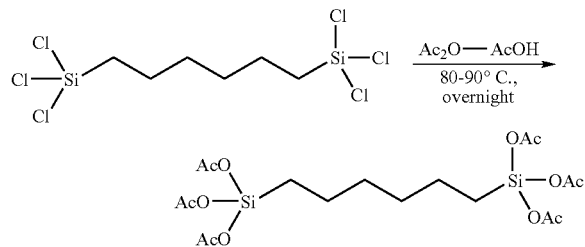

Example 14b

Change of crosslinker can, in turn, suggest varying film deposition conditions, including solvent type and polymer-crosslinker concentration ratio-such variations a matter of routine modification of synthetic technique to provide, e.g., as desired, film thickness range, optimal film robustness and smooth dielectric surface. Table 4 collects data describing optimization of ~20 nm-thick CPB films of PVP with $C_6OAc$, by changing the deposition solvent and the polymer/crosslinker ratio.

TABLE 4

CPVP-$C_6$OAc film deposition, film thickness/roughness, and capacitance values.

| Solvent | Ratio PVP:$C_6$OAc | Thickness (nm) | RMS (nm) | $C_i{}^a$ (nF cm−2) |
|---|---|---|---|---|
| THF | 4:8 | 18 | 3~3.5 | 241 |
|  | 4:6 | 17 | 2~2.5 | 251 |
|  | 4:4 | 14 | 2~2.5 | 310 |
|  | 4:0 | 22 | ~0.6 | 176 |
| dioxane | 4:8 | 12 | 4~4.5 | 397 |
|  | 4:6 | 10 | 1~1.5 | 430 |
|  | 4:4 | 8 | 1~1.5 | 445 |
|  | 4:0 | 18 | ~0.6 | 224 |
| EtOAc | 4:8 | 17 | 0.4~0.5 | 252 |
|  | 4:6 | 13 | 0.2~0.3 | 319 |
|  | 4:4 | 12 | 0.2~0.3 | 326 |
|  | 4:0 | 20 | 0.2~0.3 | 208 |

$^a$Measured in an MIS structure

Independent of the polymer-crosslinker concentration ratio, EtOAc was found to be a useful solvent to deposit CPVP-$C_6$OAc, affording very smooth surfaces. In marked contrast, THF is more suited when employing chlorosilane-based crosslinkers, as confirmed by AFM micrographs of CPVP-$C_6$OAc films deposited therefrom (not shown).

Example 14c

Figure 12A:
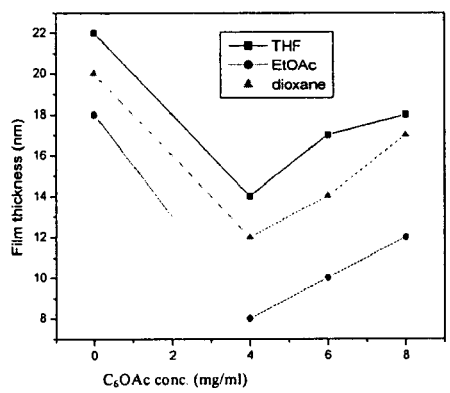
FIGS. 12A-B. Film thickness (A) and capacitance values (B) for the $CPVP-C_6OAc$ films of example 14, as a function of $C_6OAc$ concentration.
Figure 12B:
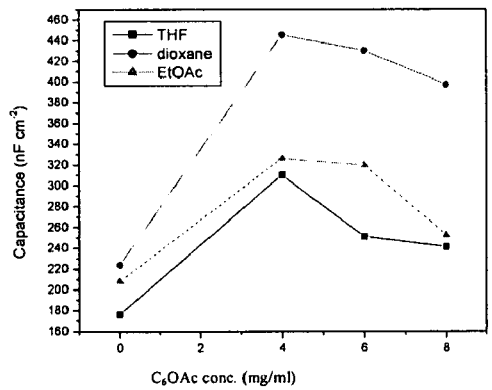

Film capacitance can vary with film thickness (FIG. 12A-B), which in turns can be a function of the deposition solvent. However, in all cases, the capacitance values are much greater than found in conventional polymers.

Example 14d

Figure 13:
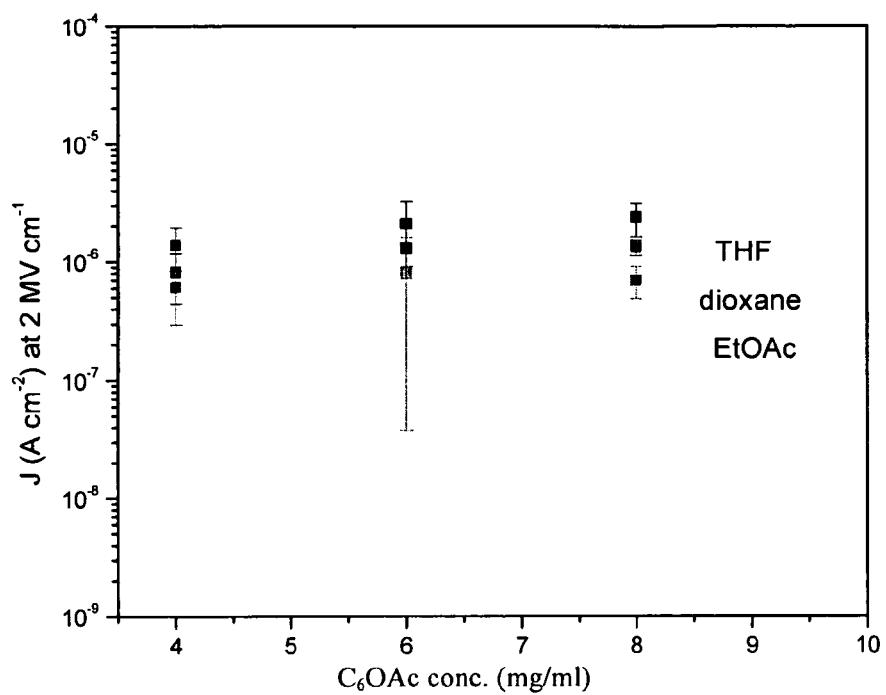
FIG. 13. Leakage current densities at 2 MV cm$^{-1}$ for different $CPVP-C_6OAc$ films, as a function of $C_6OAc$ concentration.

Leakage current densities are also very low and can be minimized when the dielectric surface morphology is optimized as shown in FIG. 13.

Example 15

Figure 14A:
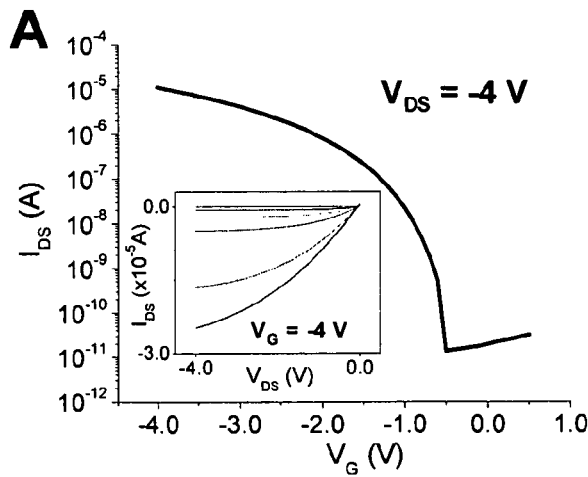
FIGS. 14A-B. Transfer (A) and output (inset A, B) plots of a $CP(S_{75}-VP_{25})-C_6$-based pentacene TFT.
Figure 14B:
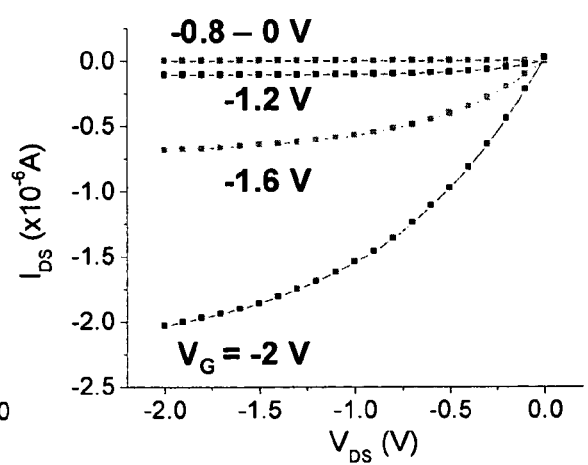

Transistors based on such crosslinked copolymers perform optimally at low biases as shown in FIGS. 14A-B. For instance, pentacene OFETs exhibit mobilities of 0.2-0.4 cm$^2$/Vs and $I_{on}$:$I_{off}$ ratios >$10^6$.

Example 16

Demonstrating other non-limiting embodiments, high-k particles of metal oxides such as $TiO_2$ ($k_{bulk}$=41), $HfO_2$, ($K_{bulk}$=25), $Gd_2O_3$($k_{bulk}$~7), and $Ba_xSr_{1-x}TiO_3$ ($k_{bulk}$=15–20) can be incorporated into any of the present compositions. The result is a new class of composite dielectrics, particle-embedded CPBs (NP—CPBs, FIG. 15). This approach permits an increase of the average polymer dielectric constant over that of the corresponding non-embedded CPB.

Figure 16A:
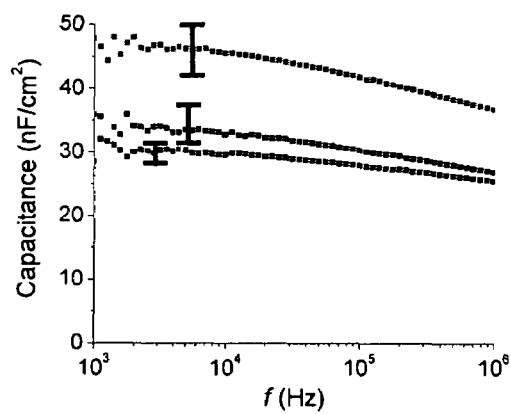
FIGS. 16A-B. Capacitance (A) and dielectric constant (B) of $TiO_2-CPVP-C_6OAc$ films with ~1-2% and ~3-5% in weight of $TiO_2$ nanoparticles. The error bars refer to thickness and $TiO_2$ concentration variations.
Figure 16B:
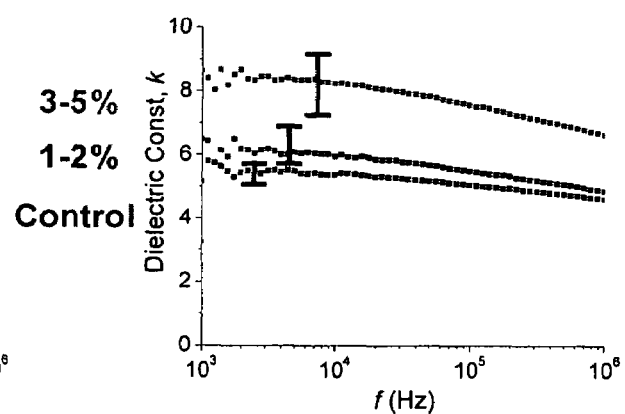

In representative experiments, NP—CPB films were fabricated by spin-coating a 1:1:1 volume mixture of PVP (60 mg/mL), $C_6OAc$ (60 mg/mL), and $TiO_2$ nanoparticles (1-6 mg/mL), resulting in films containing ~1-~5% in weight of $TiO_2$. Useful solvents include dioxane, ethylene glycol and PGMEA. Compared to the control experiments (~160 nm-thick CPVP-$C_6$OAc films; FIG. 16) the 140-180 nm-thick $TiO_2$-containing films exhibit a significant increase in film capacitance and average dielectric constant. Furthermore, compared to other nanoparticle-filled composites, the NP—CPBs of this invention are completely insoluble after moderate curing (~100 C).

Example 17

CPB curing with an IR lamp can expedite crosslinking and decrease annealing time. Initial experiments were conducted using the apparatus shown in FIG. 17. For instance, a CPVP-$C_6$OAc film is cured in 10-15 min at a temperature of 120-130° C. versus >2 h needed for films deposited from dioxane when using a conventional vacuum oven (T=100-110° C.). Furthermore, the leakage current densities of these cured films are reduced, corresponding to a reduction of the film pinhole density, as shown in FIG. 18.

As illustrated by the preceding, compositions comprising polymers with appropriate organosilane crosslinking or matrix components afford robust, smooth, adherent, pinhole-free, high-capacitance, ultra-thin (e.g., 10-20 nm and >1 μm) dielectric materials. Films thereof are readily deposited from solution, adhere strongly to a variety of conducting substrates, and are compatible with a broad range of organic semiconductors. The resulting OTFTs function at unprecedentedly low operating voltages with an ultra-thin polymer-based gate dielectric. These results demonstrate that low-leakage, high-capacitance polymer films are accessible and that the TFT devices implementing these polymer dielectrics in solution-processed fabrication methodologies offer low voltage and low power operation.

We claim:

1. A dielectric composition comprising the condensation product of a polymeric component selected from a poly(vinylphenol), a copolymer of a poly(vinylphenol), a poly(vinylalcohol), a copolymer of a poly(vinylalcohol), and combinations thereof; and a bis(silyl)alkyl component of the formula $(X)_{3-m}(Y)_m Si(Z)Si(Y')_{m'}(X')_{3-m'}$, wherein Z is a moiety selected from $(CH_2)_n$, a divalent branched alkyl group, and a divalent substituted alkyl group; n ranges from 1 to 20; X and X' are independently selected from halide, amino, alkoxy and carboxylate groups, and combinations thereof; Y and Y' are independently selected from H and alkyl; and m and m' independently range from 0 to 2.

2. The composition of claim 1 where n ranges from 3 to 14.

3. The composition of claim 1 wherein X and X' are independently selected from chloride, acetoxy and combinations thereof.

4. The composition of claim 1 comprising metal oxide particles, said particles comprising a metal component selected from a Group III metal, Group IV metal and a transition metal, and combinations thereof.

5. The composition of claim 1, wherein Z is a moiety selected from $(CH_2)_6$ and $(CH_2)_{12}$.

6. The composition of claim 1, wherein Z is $(CF_2)_n$, wherein n is as defined in claim 1.

7. A method of preparing the dielectric composition of claim 1, the method comprising contacting the polymeric component and the bis(silyl)alkyl component to provide the condensation product.

8. The method of claim 7, comprising mixing the polymeric component and the bis(silyl)alkyl component with metal oxide particles, wherein the metal oxide particles comprise a metal component selected from a Group III metal, a Group IV metal, a transition metal, and combinations thereof.

9. A method of using the dielectric composition of claim 1, the method comprising depositing the dielectric composition to provide a dielectric component.

10. The method of claim 9, wherein depositing the dielectric composition comprises spin-coating, solution-casting, or printing.

11. A dielectric composition comprising the condensation product of a polymeric component selected from a poly(vinylphenol), a copolymer of a poly(vinylphenol), a poly(vinylalcohol) and a copolymer of a poly(vinylalcohol) and combinations thereof and a bis(silylated) component of the formula $(X)_{3-m}(Y)_m Si(Z)Si(Y')_{m'}(X')_{3-m'}$, wherein Z is a moiety selected from O, $(CH_2)_n$, a divalent branched alkyl group, and a divalent substituted alkyl group; n ranges from 1 to 20; X and X' are independently selected from halide and amino groups, and combinations thereof; Y and Y' are independently selected from H and alkyl; and m and m' independently range from 0 to 2.

12. A dielectric film comprising the condensation product of a polymeric component selected from a poly(vinylphenol), a copolymer of a poly(vinylphenol), a poly(vinylalcohol), a copolymer of a poly(vinylalcohol), and combinations thereof; and a bis(silylated) component of the formula $(X)_{3-m}(Y)_m Si(Z)Si(Y')_{m'}(X')_{3-m'}$, wherein Z is a moiety selected from O, $(CH_2)_n$, a divalent branched alkyl group, and a divalent substituted alkyl group; n ranges from 1 to 20; X and X' are independently selected from halide, amino, alkoxy and carboxylate groups, and combinations thereof Y and Y' are independently selected from H and alkyl; and m and m' independently range from 0 to 2;
   wherein the dielectric film has a thickness between about 10 nm and about 30 nm, and exhibits a capacitance of at least about 150 nF cm$^{-2}$.

13. A composite comprising a dielectric component comprising the composition of claim 1 and a semiconductor component comprising a compound selected from an n-type semiconductor material and a p-type semiconductor material.

14. The composite of claim 13, wherein the dielectric component has a thickness from about 10 nm to about 1 micron.

15. The composite of claim 13, wherein the dielectric component has a thickness dimension less than about 20 nm.

16. The composite of claim 13, wherein the semiconductor component comprises a compound selected from a fused heterocycle, a fused aromatic compound, and combinations thereof.

17. The composite of claim 13, wherein the semiconductor component comprises a compound selected from a polythiophene, a pentacene, and a phthalocyanine.

18. The composite of claim 13, wherein the composite is on a substrate.

19. The composite of claim 18, wherein the substrate is flexible.

20. The composite of claim 18, wherein the substrate comprises a gate component of a transistor device, the transistor device comprising source and drain electrodes.

21. The composite of claim 20, wherein the transistor device is a field-effect transistor.

22. The composite of claim 20, wherein the transistor device is an organic thin-film transistor.

23. The composite of claim 20, wherein the transistor device is a complementary logic device.

24. The composite of claim 23, wherein the complementary logic device is an inverter.

* * * * *

UNITED STATES PATENT AND TRADEMARK OFFICE
CERTIFICATE OF CORRECTION

PATENT NO. : 7,605,394 B2
APPLICATION NO. : 11/315076
DATED : October 20, 2009
INVENTOR(S) : Marks et al.

It is certified that error appears in the above-identified patent and that said Letters Patent is hereby corrected as shown below:

At column 1, lines 9-10, delete "N00014-62-0909 (0650-300-F445)" and replace with --N00014-02-1-0909--.

At column 1, line 10, delete "NCC 2-3163" and replace with --NCC 2-1363--.

Signed and Sealed this

First Day of December, 2009

David J. Kappos
*Director of the United States Patent and Trademark Office*

UNITED STATES PATENT AND TRADEMARK OFFICE
CERTIFICATE OF CORRECTION

PATENT NO.        : 7,605,394 B2
APPLICATION NO.   : 11/315076
DATED             : October 20, 2009
INVENTOR(S)       : Marks et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 768 days.

Signed and Sealed this

Fourteenth Day of December, 2010

David J. Kappos
*Director of the United States Patent and Trademark Office*